US012713721B2

(12) United States Patent
Yoneda et al.

(10) Patent No.: US 12,713,721 B2
(45) Date of Patent: Aug. 18, 2026

(54) IMAGING DEVICE

(71) Applicant: SEMICONDUCTOR ENERGY LABORATORY CO., LTD., Atsugi (JP)

(72) Inventors: Seiichi Yoneda, Isehara (JP); Yusuke Negoro, Kaizuka (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 855 days.

(21) Appl. No.: 17/640,430

(22) PCT Filed: Aug. 25, 2020

(86) PCT No.: PCT/IB2020/057914
§ 371 (c)(1),
(2) Date: Mar. 4, 2022

(87) PCT Pub. No.: WO2021/048669
PCT Pub. Date: Mar. 18, 2021

(65) Prior Publication Data

US 2022/0344392 A1 Oct. 27, 2022

(30) Foreign Application Priority Data

Sep. 11, 2019 (JP) ................................ 2019-165028
Oct. 11, 2019 (JP) ................................ 2019-187400

(51) Int. Cl.
*H10F 39/00* (2025.01)
*H04N 25/59* (2023.01)
(Continued)

(52) U.S. Cl.
CPC ........... *H10F 39/803* (2025.01); *H04N 25/59* (2023.01); *H04N 25/771* (2023.01);
(Continued)

(58) Field of Classification Search
CPC ........... H01L 27/14609; H01L 27/1207; H01L 27/1225; H01L 27/1255; H01L 27/1464;
(Continued)

(56) References Cited

U.S. PATENT DOCUMENTS 7,460,162 B2 12/2008 Koizumi et al.
7,800,673 B2 9/2010 Sugawa et al.
(Continued)

FOREIGN PATENT DOCUMENTS

EP 2362642 A 8/2011
EP 2793264 A 10/2014
(Continued)

OTHER PUBLICATIONS

International Search Report (Application No. PCT/IB2020/057914) Dated Nov. 10, 2020.
(Continued)

*Primary Examiner* — Sinh Tran
*Assistant Examiner* — Angel L Garces-Rivera
(74) *Attorney, Agent, or Firm* — Fish & Richardson P.C.

(57) ABSTRACT

An imaging device capable of taking an image in both a dark environment and a bright environment in a light amount range equivalent to or greater than that of human vision is desired. A wide dynamic range and high image quality are achieved. In order to obtain an image with a widened dynamic range, two capacitors, a large capacitor and a small capacitor, are provided in one pixel. The large capacitor is formed to be interposed between a transistor for controlling the amount of charge overflowed from the small capacitor and a transistor for resetting accumulated charge, and OS transistors are used as these two transistors. The OS transistor has extremely low off-state current characteristics, and thus can widen the dynamic range of imaging.

9 Claims, 12 Drawing Sheets

(51) Int. Cl.

| | |
|---|---|
| ***H04N 25/77*** | (2023.01) |
| ***H04N 25/771*** | (2023.01) |
| ***H10D 86/40*** | (2025.01) |
| ***H10D 86/60*** | (2025.01) |
| ***H10D 87/00*** | (2026.01) |

(52) U.S. Cl.
CPC ......... *H10D 86/423* (2025.01); *H10D 86/481* (2025.01); *H10D 86/60* (2025.01); *H10D 87/00* (2025.01)

(58) Field of Classification Search
CPC ......... H01L 27/14636; H01L 27/14638; H01L 29/78648; H01L 29/7869; H01L 27/14612; H01L 27/14605; H01L 27/14618; H01L 27/14634; H04N 25/59; H04N 25/771; H04N 23/50; H04N 23/55; H04N 25/70; H04N 25/76
See application file for complete search history.

(56) References Cited

U.S. PATENT DOCUMENTS

| | | | | |
|---|---|---|---|---|
| 8,917,341 | B2 | 12/2014 | Sakano et al. | |
| 9,117,713 | B2 | 8/2015 | Koyama | |
| 9,332,200 | B1 | 5/2016 | Hseih et al. | |
| 9,431,449 | B2 | 8/2016 | Toda | |
| 9,560,296 | B2 | 1/2017 | Hseih et al. | |
| 9,692,997 | B2 | 6/2017 | Hseih et al. | |
| 9,905,596 | B2 | 2/2018 | Koyama | |
| 9,954,003 | B2 | 4/2018 | Matsuda et al. | |
| 10,033,952 | B2 | 7/2018 | Ohmaru | |
| 10,154,222 | B2 | 12/2018 | Sugawa et al. | |
| 10,200,641 | B2 | 2/2019 | Sugawa et al. | |
| 10,236,318 | B2 | 3/2019 | Toda | |
| 10,455,174 | B2 | 10/2019 | Ikeda | |
| 10,547,802 | B2 | 1/2020 | Sakakibara et al. | |
| 10,720,467 | B2 | 7/2020 | Sugawa et al. | |
| 10,805,561 | B2 | 10/2020 | Sakakibara et al. | |
| 10,903,257 | B2 | 1/2021 | Toda | |
| 2008/0266434 | A1 | 10/2008 | Sugawa et al. | |
| 2011/0108706 | A1 | 5/2011 | Koyama | |
| 2015/0048362 | A1* | 2/2015 | Endo | H10D 86/60 257/43 |
| 2017/0054930 | A1 | 2/2017 | Ohmaru et al. | |
| 2017/0069673 | A1 | 3/2017 | Ikeda | |
| 2017/0078606 | A1 | 3/2017 | Ohmaru | |
| 2018/0115730 | A1 | 4/2018 | Velichko | |
| 2020/0260026 | A1* | 8/2020 | Ono | H01L 27/14603 |
| 2021/0183926 | A1 | 6/2021 | Choi et al. | |

FOREIGN PATENT DOCUMENTS

| | | | |
|---|---|---|---|
| JP | 2005-328493 | A | 11/2005 |
| JP | 2008-035395 | A | 2/2008 |
| JP | 2011-119710 | A | 6/2011 |
| JP | 2011-199816 | A | 10/2011 |
| JP | 2017-055403 | A | 3/2017 |
| JP | 2017-147445 | A | 8/2017 |
| JP | 2018-107799 | A | 7/2018 |
| JP | 2019-080305 | A | 5/2019 |
| WO | WO-2011/055625 | | 5/2011 |
| WO | WO-2013/088983 | | 6/2013 |
| WO | WO-2016/080337 | | 5/2016 |
| WO | WO-2016/089547 | | 6/2016 |
| WO | WO-2016/089548 | | 9/2016 |
| WO | WO-2018/234925 | | 12/2018 |
| WO | WO-2019/078110 | | 4/2019 |

OTHER PUBLICATIONS

Written Opinion (Application No. PCT/IB2020/057914) Dated Nov. 10, 2020 .

* cited by examiner

FIG. 5A
500
560b 560 560a 545 542a 540a 540b 542b 581 574 580 524 522 520 516 514 512 544 543a 503a 503b 503 530a 530b 530 543b
FIG. 5B
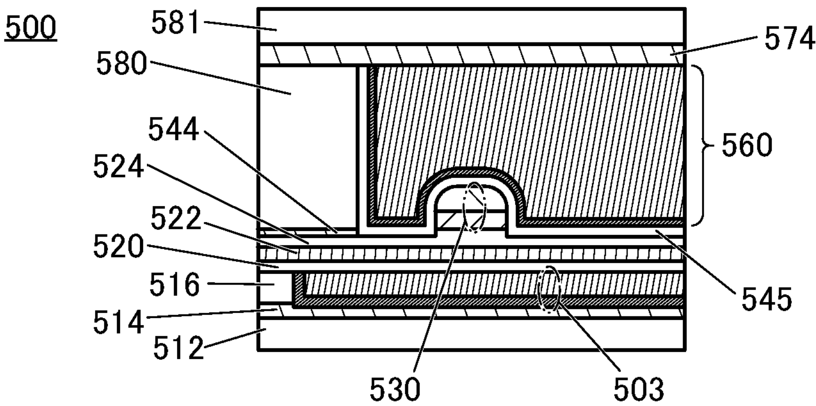
FIG. 5C
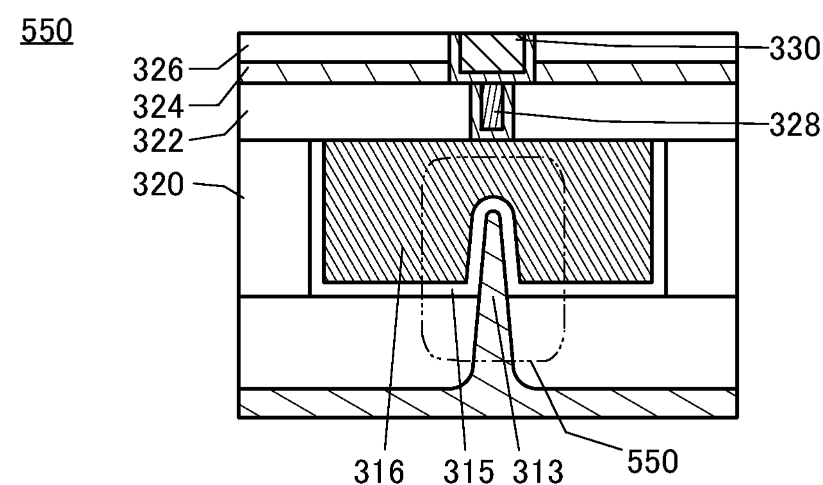

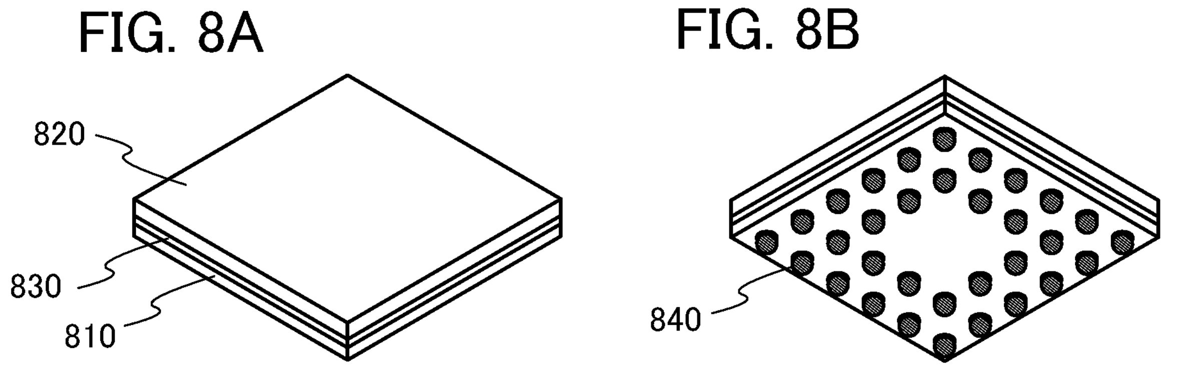
FIG. 8A
820
830
810
FIG. 8B
840
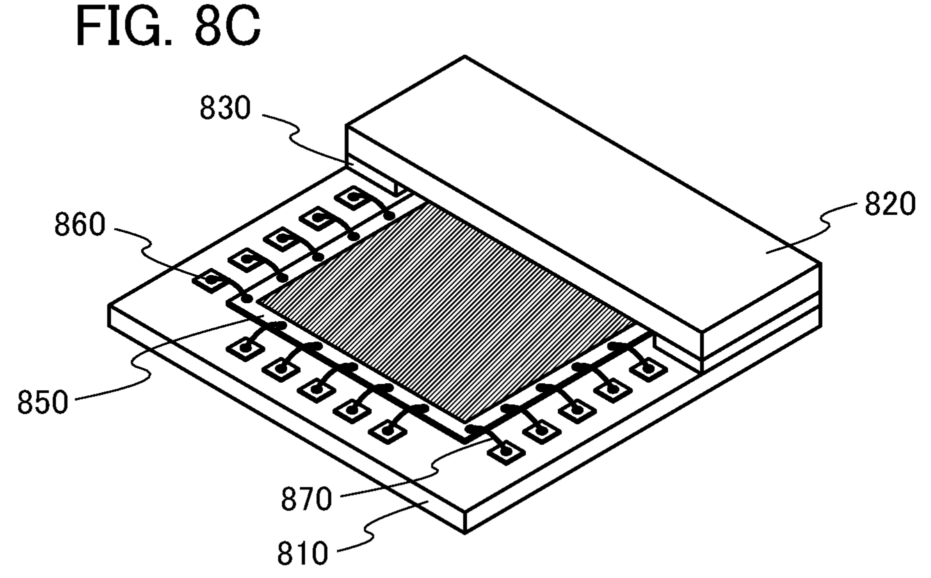
FIG. 8C
830
820
860
850
870
810
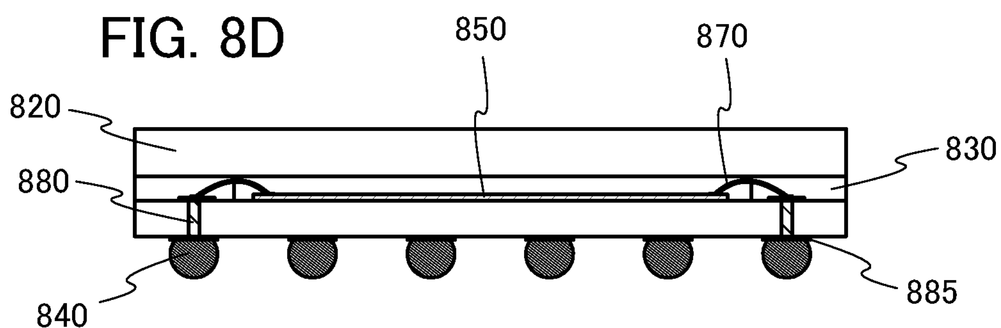
FIG. 8D
850
870
820
830
880
840
885

835
821
811

841

851
835
821
861
890
841
871
811

835
821
871
841
890
851

FD
CS

IMAGING DEVICE

CROSS REFERENCE TO RELATED APPLICATIONS

This application is a U.S. National Phase Application under 35 U.S.C. § 371 of International Application PCT/IB2020/057914, filed on Aug. 25, 2020, which is incorporated by reference and claims the benefit of foreign priority applications filed in Japan on Sep. 11, 2019, as Application No. 2019-165028 and on Oct. 11, 2019, as Application No. 2019-187400.

TECHNICAL FIELD

One embodiment of the present invention relates to an imaging device using an oxide semiconductor and a manufacturing method thereof.

Note that one embodiment of the present invention is not limited to the above technical field. One embodiment of the invention disclosed in this specification and the like relates to an object, a method, and a manufacturing method. One embodiment of the present invention relates to a process, a machine, manufacture, or a composition of matter. Accordingly, specific examples of the technical field of one embodiment of the present invention disclosed in this specification and the like include a semiconductor device, an imaging device, a display device, a light-emitting device, a power storage device, a memory device, an electronic device, an input device, an input/output device, a driving method thereof, and a manufacturing method thereof.

Note that in this specification, a semiconductor device refers to any device that can function by utilizing semiconductor characteristics, and an imaging device, an electro-optical device, a semiconductor circuit, and an electronic device are all semiconductor devices.

BACKGROUND ART

An image sensor is widely used as a component of a digital camera or a video camera for imaging. The image sensor is also used in part of a security device such as a security camera. A security camera needs to perform accurate imaging not only in a bright place during the day time, but also during the night time or in a dark place with little light, and thus requires an image sensor with a wide dynamic range.

An imaging device with a structure where a transistor including an oxide semiconductor is used in part of a pixel circuit is disclosed in Patent Document 1.

A solid-state imaging device with a wider dynamic range and an optical sensor are disclosed in Patent Document 2.

REFERENCES

Patent Documents

[Patent Document 1] Japanese Published Patent Application No. 2017-55403

[Patent Document 2] Japanese Published Patent Application No. 2005-328493

SUMMARY OF THE INVENTION

Problems to be Solved by the Invention

An imaging device capable of obtaining an image in both a dark environment and a bright environment in a light amount range equivalent to or greater than that of human vision is desired. An object is to manufacture an imaging device which can achieve a wide dynamic range and high image quality.

Another object is to downsize an imaging device.

Means for Solving the Problems

In order to obtain an image with a widened dynamic range, a structure is employed in which two capacitors, a large capacitor and a small capacitor, are provided in one pixel so that charge is accumulated only in the small capacitor in a dark environment and charge is accumulated not only in the small capacitor but also in the large capacitor for the amount overflowed from the small capacitor in a bright environment; this enables accumulation and output of charge corresponding to illuminance without saturation of output, in a wide illuminance range.

The large capacitor is formed to be interposed between a transistor for controlling the amount of charge overflowed from the small capacitor and a transistor for resetting accumulated charge. For example, as each of the two transistors, a transistor including an oxide semiconductor in an active layer (hereinafter referred to as an OS transistor) is used. The OS transistor has extremely low off-state current characteristics, and thus can widen the dynamic range of imaging.

In addition, two silicon transistors are connected to a photodiode formed to be embedded in a silicon substrate. As the silicon substrate, a single crystal semiconductor substrate, a polycrystalline semiconductor substrate, or a compound semiconductor substrate can be used.

As the silicon substrate, an SOI (Silicon on Insulator) substrate or the like may be used. As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a Smart-Cut method in which a semiconductor substrate is cleaved by utilizing growth of a minute void, which is formed by implantation of a hydrogen ion, due to thermal treatment, by using an ELTRAN method (a registered trademark: Epitaxial Layer Transfer), or the like. A transistor formed using a single crystal substrate contains a single crystal semiconductor in a channel formation region.

The above structure can achieve a circuit structure with a low leakage current both when the imaging device is in a dark environment and when in a bright environment. As a result, the measured SN ratio (Signal to Noise Ratio) of the imaging device is improved, and the measured image quality of the imaging device is improved. Furthermore, the OS transistor reduces leakage and thus prevents deterioration of an image before reading.

One structure of the invention disclosed in this specification is an imaging device including a first transistor to a sixth transistor, a photoelectric conversion element, a first capacitor, and a second capacitor. One electrode of the photoelectric conversion element is electrically connected to one of a source and a drain of the first transistor. The other of the source and the drain of the first transistor is electrically connected to one of a source and a drain of the second transistor. The other of the source and the drain of the first transistor is electrically connected to one electrode of the first capacitor. The other of the source and the drain of the first transistor is electrically connected to a gate electrode of the third transistor. One of a source and a drain of the third transistor is electrically connected to one of a source and a drain of the fourth transistor. The other of the source and the drain of the second transistor is electrically connected to one electrode of the second capacitor. The one electrode of the second capacitor is electrically connected to one of a source and a drain of the fifth transistor. One of a source and a drain of the sixth transistor is electrically connected to the one of the source and the drain of the first transistor. The first transistor, the third transistor, the fourth transistor, and the sixth transistor each contain silicon in a region where a channel is formed.

In the imaging device having the above structure, the second transistor and the fifth transistor each include an oxide semiconductor in a region where a channel is formed. Alternatively, in the imaging device having the above structure, the second transistor and the fifth transistor may each contain silicon.

In the above structure, the second capacitor has larger capacitance than the first capacitor. These capacitors are called lateral overflow integration capacitors (LOFICs) in some cases.

In the above structure, the photoelectric conversion element and the first transistor are provided to be adjacent to each other, the photoelectric conversion element is provided to be adjacent to the source or the drain of the sixth transistor, and the first transistor, the photoelectric conversion element, and the source or the drain of the sixth transistor are manufactured on the same silicon substrate.

Effect of the Invention

One embodiment of the present invention can achieve an imaging device capable of taking an image in both a dark environment and a bright environment in the light amount range equivalent to or greater than that of human vision. In addition, an imaging device capable of achieving a widened dynamic range and high image quality can be manufactured.

BRIEF DESCRIPTION OF THE DRAWINGS

FIG. 5A to FIG. 5C are diagrams illustrating transistor structure examples.

FIG. 8A to FIG. 8C are perspective views of a package including an imaging device, and FIG. 8D is a cross-sectional view.

MODE FOR CARRYING OUT THE INVENTION

Figure 1:
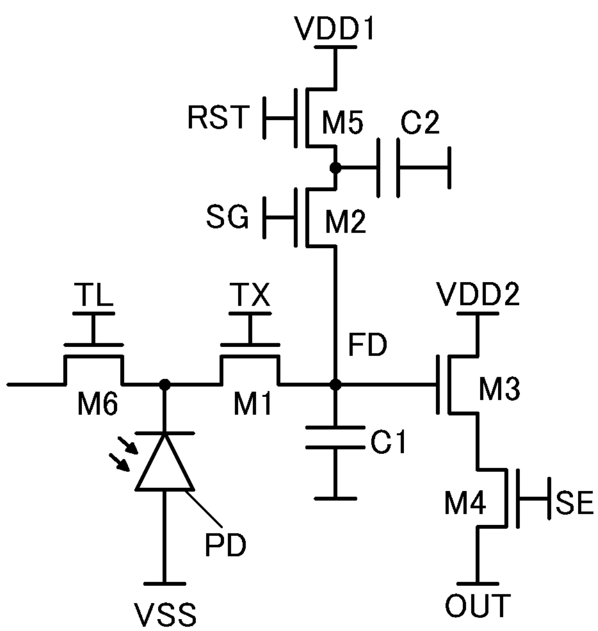
FIG. 1 is an equivalent circuit diagram illustrating one embodiment of the present invention.

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Note that the ordinal numbers such as first and second are used for convenience and do not denote the order of steps or the stacking order of layers. Therefore, for example, description can be made even when "first" is replaced with "second", "third", or the like, as appropriate. In addition, the ordinal numbers put in this specification and the like do not correspond to the ordinal numbers that are used to specify one embodiment of the present invention in some cases.

Note that, in the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, for example, any of the following expressions can be used.

The expression "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order" can be used, for example. Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order" can be used. When the connection order in a circuit structure is defined by an expression similar to these examples, a source (or a first terminal or the like) and a drain (or a second terminal or the like) of a transistor can be distinguished from each other to specify the technical scope.

As another way of expression, the expression "a source (or a first terminal or the like) of a transistor is electrically connected to X through at least a first connection path, the first connection path does not include a second connection path, the second connection path is a path, through the transistor, between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" can be used, for example. Alternatively, the expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can be used. Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to these examples, a source (or a first terminal or the like) and a drain (or a second terminal or the like) of a transistor can be distinguished from each other to specify the technical scope.

Note that these expressions are just examples and expressions are not limited to these expressions. Here, X, Y, Z1, and Z2 are each an object (a device, an element, a circuit, a wiring, an electrode, a terminal, a conductive film, or a layer, for example).

Note that even if a circuit diagram shows that independent components are electrically connected to each other, one component has functions of a plurality of components in some cases. For example, when part of a wiring also functions as an electrode, one conductive film has functions of both of the components, the function of a wiring and the function of an electrode. Thus, electrical connection in this specification also includes such a case where one conductive film has functions of a plurality of components, in its category.

Embodiment 1

In this embodiment, an imaging device of one embodiment of the present invention is described with reference to drawings.

FIG. 1 is a circuit diagram of one of a plurality of pixels included in the imaging device of one embodiment of the present invention.

In the pixel, one electrode of a photoelectric conversion element PD is electrically connected to one of a source and a drain of a transistor M1. The other of the source and the drain of the transistor M1 is electrically connected to one of a source and a drain of a transistor M2. The other of the source and the drain of the transistor M1 is electrically connected to one electrode of a first capacitor C1. The other of the source and the drain of the transistor M1 is electrically connected to a gate electrode of a transistor M3. One of a source and a drain of the transistor M3 is electrically connected to one of a source and a drain of a transistor M4. The other of the source and the drain of the transistor M2 is electrically connected to one electrode of a second capacitor C2. The one electrode of the second capacitor C2 is electrically connected to one of a source and a drain of a transistor M5. One of a source and a drain of a transistor M6 is electrically connected to the one of the source and the drain of the transistor M1.

Here, a node FD is connected to the other of the source and the drain of the transistor M1, the one of the source and the drain of the transistor M2, the gate electrode of the transistor M3, and the one electrode of the first capacitor C1.

The other electrode of the photoelectric conversion element PD is electrically connected to a wiring (VSS). The photoelectric conversion element PD generates signal charge in accordance with the amount of received light and accumulates the signal charge.

The other of the source and the drain of the transistor M5 is electrically connected to a wiring (VDD1). The other of the source and the drain of the transistor M3 is electrically connected to a wiring (VDD2).

The other of the source and the drain of the transistor M4 is electrically connected to a wiring (OUT).

In the connection between the above components, an example is illustrated in which a plurality of transistors or a plurality of capacitors are electrically connected to a wiring to share it; however, they may be electrically connected to different wirings.

The transistor M1 functions as a transfer switch. Charge generated in the photoelectric conversion element PD is transferred to the node FD, which is controlled by a gate TX. An overflow path is provided in the channel formation region of the transistor M1.

The transistor M2 can be regarded as a second transfer switch controlled by a gate SG, and charge is accumulated in the capacitor C2 when the transistor M2 is in an on state.

The transistor M3 is a source follower transistor, and the node FD is connected to the gate.

The transistor M4 is a selection transistor and is controlled by a gate SE.

The transistor M5 is a reset transistor and is controlled by a gate RST. The transistor M5 resets the capacitor C1 connected to the node FD. The transistor M5 resets the capacitor C2 at the same time.

The transistor M6 is provided to reduce leakage of the transistor M1, and brought into an on state when a signal is applied to a gate TL. The signal applied to the transistor M6 controls the transistor M6 so that leakage to the capacitor C1 is prevented.

Figure 11:
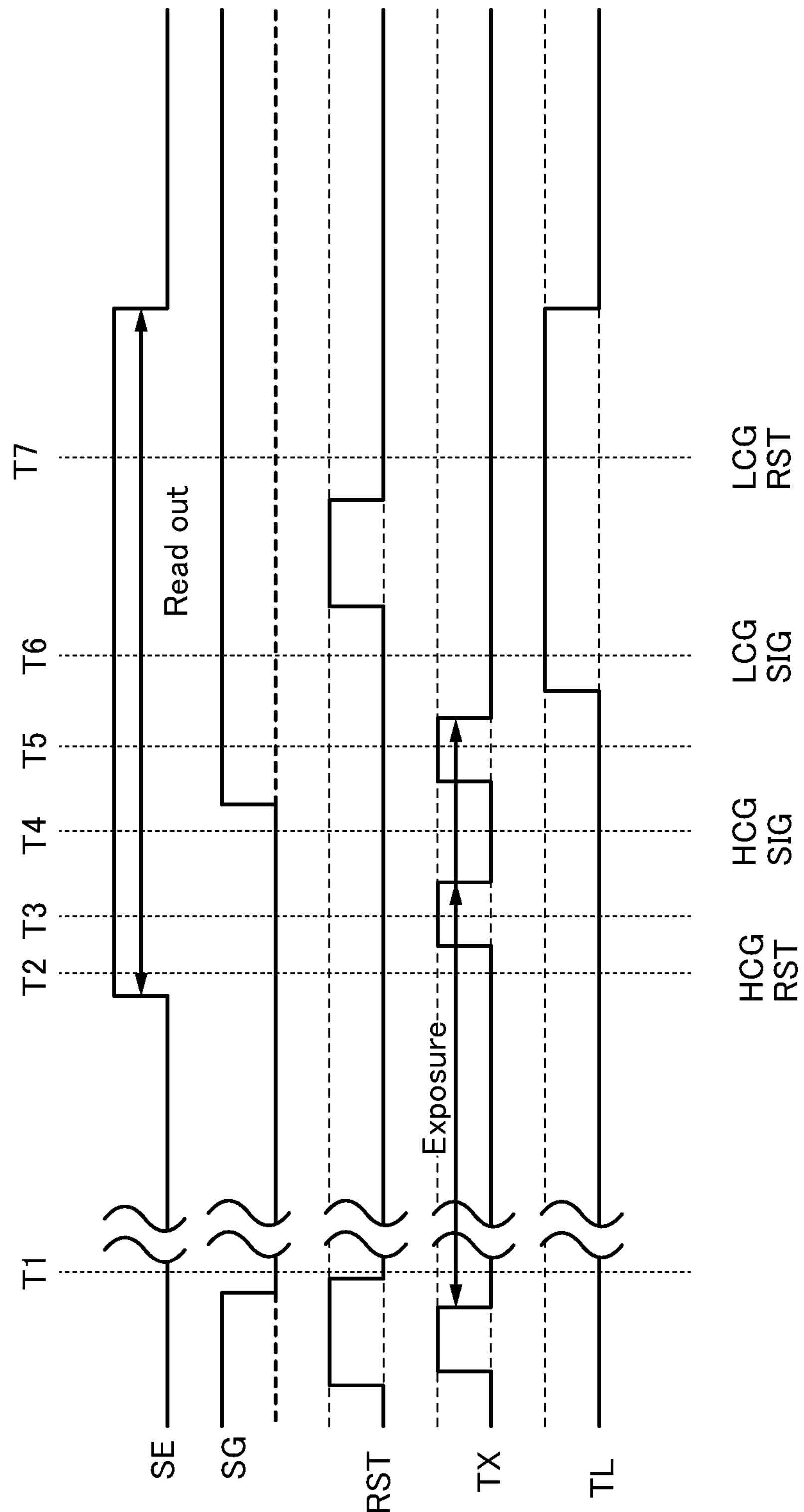
FIG. 11 is a diagram showing an example of a timing chart showing one embodiment of the present invention.

FIG. 11 shows an example of a timing chart. In FIG. 11, an exposure period (accumulation period, Exposure) and a reading period (Read out) are indicated by arrows. At Time T1 after exposure is started, a high-gain-mode period (HCG) in which an image signal is read out at high conversion gain is performed. HCGRST denotes a reset time and HCGSIG denotes an output time. At Time T5, a low-gain-mode period (LCG) in which the capacitance of FD is changed and an image signal is read out at low conversion gain is performed. LCGRST denotes a reset time and LCGSIG denotes an output time. As shown in FIG. 11, the transistor M6 is driven in accordance with the gate TL, and brought into an on state at a timing where the transistor M6 is set at a High level after the exposure period. Note that FD denotes floating diffusion. In addition, CS denotes capacitance of a relatively deep potential.

In this embodiment, both the transistor M2 and the transistor M5 connected to the capacitor C2 are formed using OS transistors each of which uses an oxide semiconductor in a channel formation region, and the other transistors are fabricated on a silicon substrate. When the transistor M2 and the transistor M5 are formed using OS transistors, the amount of voltage change of the capacitor due to a leakage current can be reduced. Alternatively, instead of partly using the OS transistors, both the transistor M2 and the transistor M5 may be formed using silicon transistors to shorten the manufacturing process.

In the case where the photoelectric conversion element PD receives a large amount of light and charge is overflowed from the capacitor C1 of the node FD, that is, in the case where the illuminance is high, the charge is accumulated in the capacitor C1 and the capacitor C2.

In the case where the photoelectric conversion element PD receives a small amount of light and charge can be held in the capacitor C1 of the node FD, that is, in the case where the illuminance is low, the charge is accumulated only in the capacitor C1.

Under both high illuminance and low illuminance, reading operation of a pixel circuit is performed in the following order: a reset period, a reset level reading period for high illuminance, a reset level reading period for low illuminance, a light charge transfer period, a signal level reading period for low illuminance, and a signal level reading period for high illuminance.

Figures 12A, 12B, 12C, 12D, 12E, 12F, 12G:
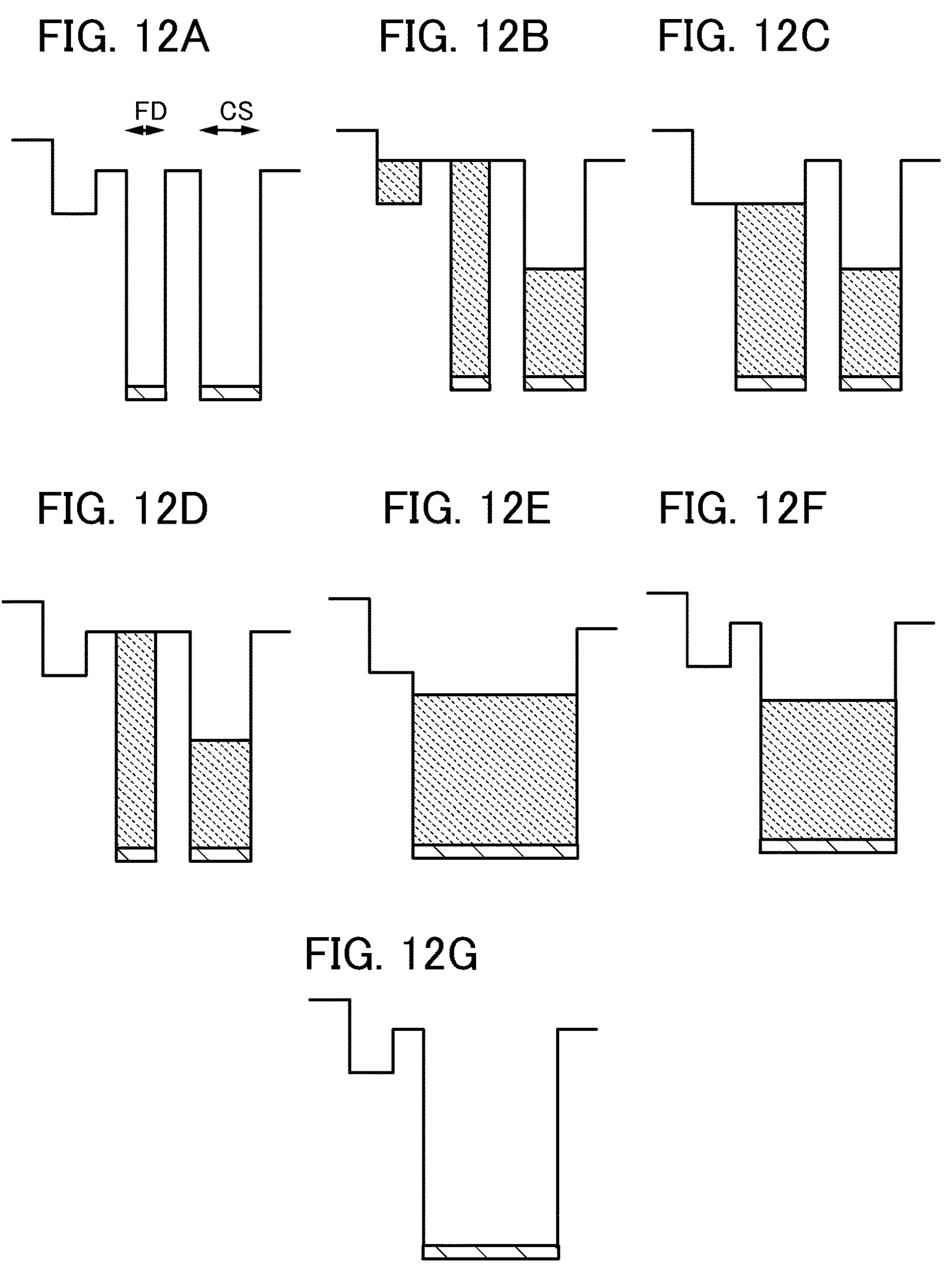
FIG. 12A to FIG. 12G are examples of potential diagrams at timings in the timing chart in FIG. 11.

As for driving methods of the transistors other than the transistor M6, FIG. 12 shows examples of potential diagrams at timings in the timing chart. FIG. 12A is an example of a potential diagram at Time T1 in FIG. 11, FIG. 12B is an example of a potential diagram at Time T2 in FIG. 11, and FIG. 12C is an example of a potential diagram at Time T3 in FIG. 11. FIG. 12D is an example of a potential diagram at Time T4 in FIG. 11, FIG. 12E is an example of a potential diagram at Time T5 in FIG. 11, FIG. 12F is an example of a potential diagram at Time T6 in FIG. 11, and FIG. 12G is an example of a potential diagram at Time T7 in FIG. 11. Since the driving method of the pixel circuit having the LOFIC structure is known, the detailed description thereof is omitted here.

Figure 2A:
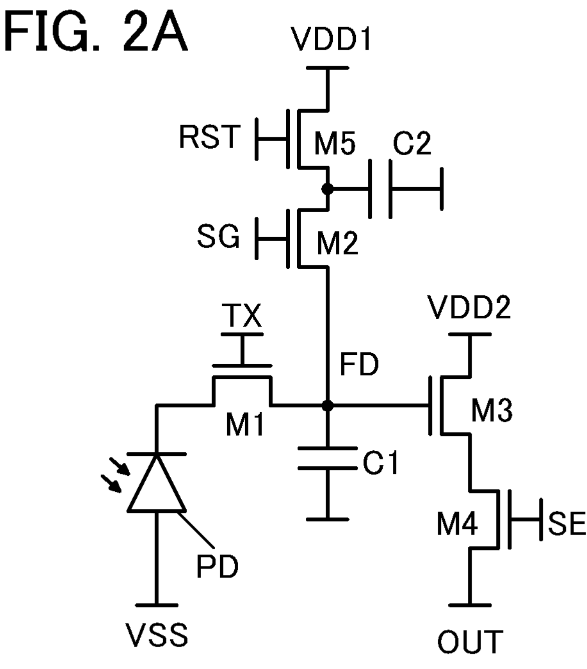
FIG. 2A and FIG. 2B are equivalent circuit diagrams illustrating variations.

FIG. 2A illustrates a structure in which the transistor M6 is removed from the circuit structure in FIG. 1. When at least the transistor M2 and the transistor M5 are formed using OS transistors, FIG. 2A is a modification example of FIG. 1. In the case where the transistors M1, M2, M3, M4, and M5 are formed on a silicon substrate, FIG. 2A corresponds to a conventional example. Since the driving method of the circuit in FIG. 2A in the case where the transistors M1, M2, M3, M4, and M5 are formed on a silicon substrate is known as that of the pixel circuit having the LOFIC structure, the detailed description thereof is omitted here.

Figure 2B:
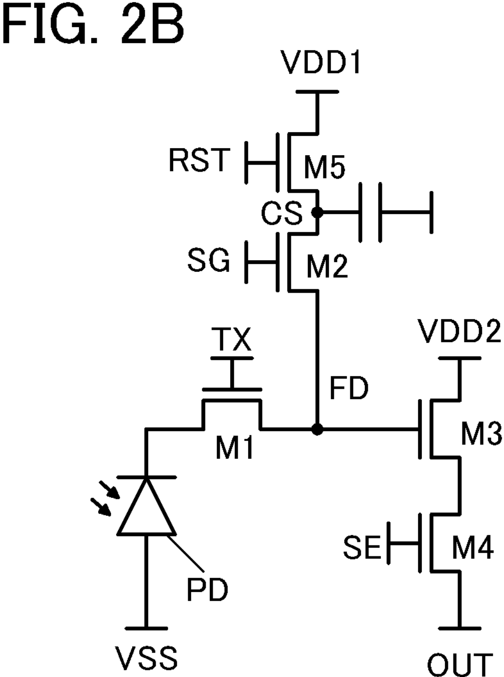

FIG. 2B illustrates an example of a circuit in which the first capacitor C1 illustrated in FIG. 2A is not illustrated. In addition, a node CS is illustrated. When comparison was made between a case where the transistor M2 and the transistor M5 are formed on a silicon substrate and a case where the transistor M2 and the transistor M5 are formed using OS transistors in the circuit illustrated in FIG. 2B, the voltage change amount of the capacitor was estimated to be 11.2 mV in the former case, and the voltage change amount of the capacitor was estimated to be 0.37 nV in the latter case. Note that the estimation was performed under the following conditions: the frame rate was 60 fps, the leakage current of the silicon transistors was 30 fA, the leakage currents of the OS transistors were each 1 zA, and the capacitance was 45 fF. As described above, in the imaging device of one embodiment of the present invention, the amount of voltage change of the capacitor due to the leakage current can be reduced in the case where OS transistors are used as the transistor M2 and the transistor M5. Thus, the dynamic range of imaging by the imaging device can be widened.

Figure 3:
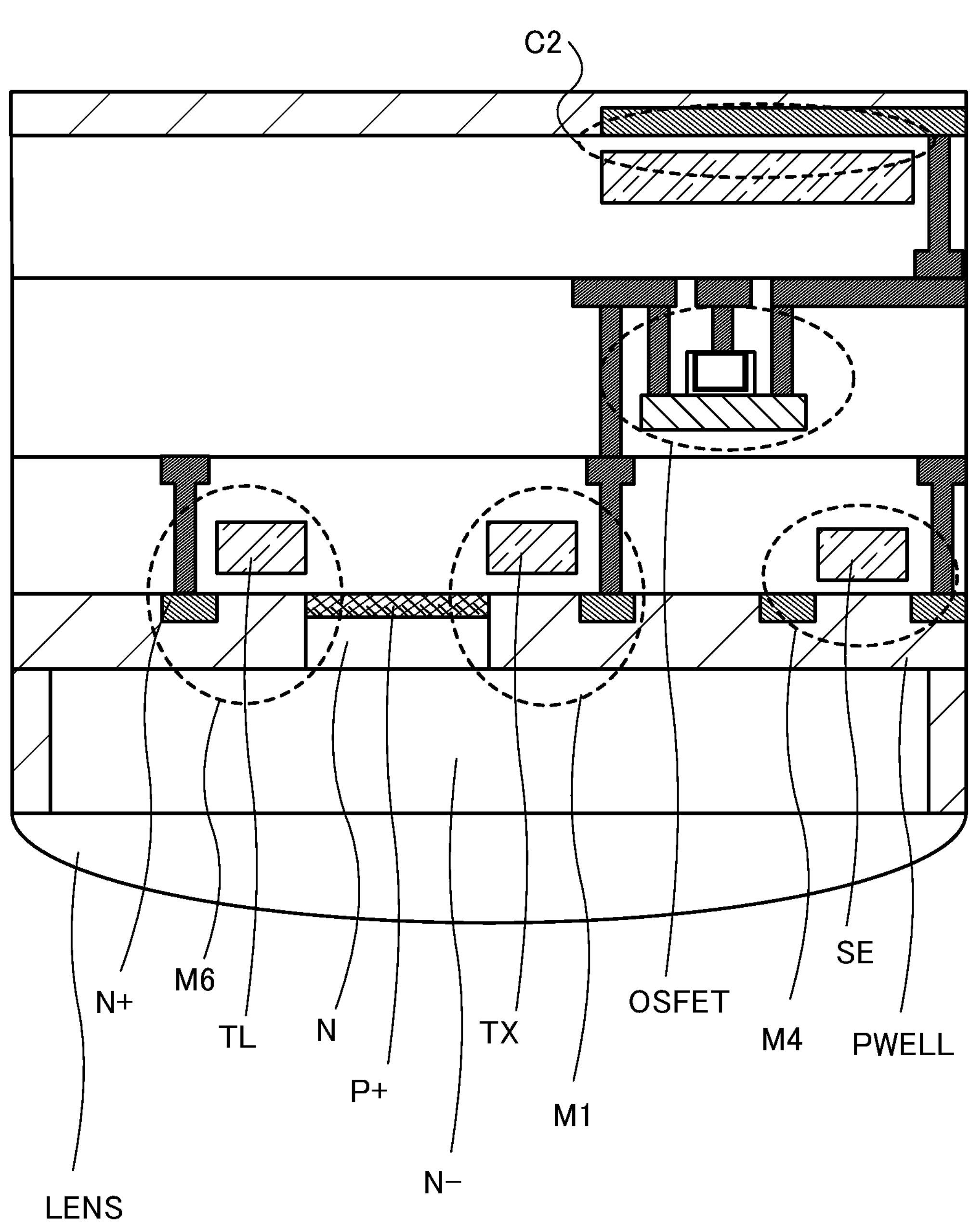
FIG. 3 is a schematic cross-sectional view of an image sensor chip illustrating one embodiment of the present invention.

FIG. 3 illustrates an example of a schematic cross-sectional view of a back-surface irradiation image sensor chip.

FIG. 3 is a cross-sectional view of a chip fabricated in such a manner that a silicon substrate on which silicon transistors are formed and an OS transistor (OSFET) is formed thereover is bonded to another silicon substrate on which the capacitor C2 is provided. Wiring layers provided on the silicon substrates are bonded to each other by a bonding technique such as Cu—Cu bonding or a micro bump. Note that the Cu—Cu bonding is a technique that establishes electrical continuity by connecting Cu (copper) pads. A back gate for controlling a threshold voltage may be provided below the OSFET in FIG. 3.

In FIG. 3, a back surface of the silicon substrate is provided with a microlens LENS. Although the silicon substrate and the microlens LENS are provided in contact with each other in FIG. 3, a color filter or a black matrix may be provided between the silicon substrate and the microlens LENS.

A silicon substrate including a P-type well PWELL is doped with an N-type impurity (e.g., phosphorus) to form an N-type high concentration region N+, so that a source region or a drain region of each transistor is formed.

FIG. 3 illustrates the transistor M1, the transistor M4, and the transistor M6. In addition, the gate TL of the transistor M6 is also illustrated. A P-type region P+ doped with a P-type impurity (e.g., boron) at a high concentration is provided between the channel formation region of the transistor M1 and the channel formation region of the transistor M6. Furthermore, an N-type region N having a lower concentration than the N-type high concentration region N+ is provided below the P-type region P+, and an N-type low concentration region N− having a lower concentration than the N-type region N is provided below the N-type region N. The stack of the P-type region P+, the N-type region N, and the N-type low concentration region N− forms the photoelectric conversion element PD.

Although not illustrated in FIG. 3, the capacitor C1 is formed in such a manner that the transistor M3 is formed on a silicon substrate and an electrode is formed over the gate of the transistor M3 with an insulating layer therebetween.

Although FIG. 3 illustrates an example of the back-surface irradiation (also referred to as back-surface incident) image sensor chip, there is no particular limitation and a surface-incident image sensor chip may be used. In addition, although an example of bonding another silicon substrate on which the capacitor C2 is provided is illustrated, there is no particular limitation and an image sensor chip in which another substrate is not bonded and the capacitor C2 is stacked above the OS transistor may be used. Alternatively, an image sensor chip in which a trench capacitor is stacked as the capacitor C2 may be used.

Embodiment 2

In this embodiment, a structure of the OS transistor (OSFET) used for the image sensor chip illustrated in FIG. 3 and the manufacturing process thereof are described.

Figure 4:
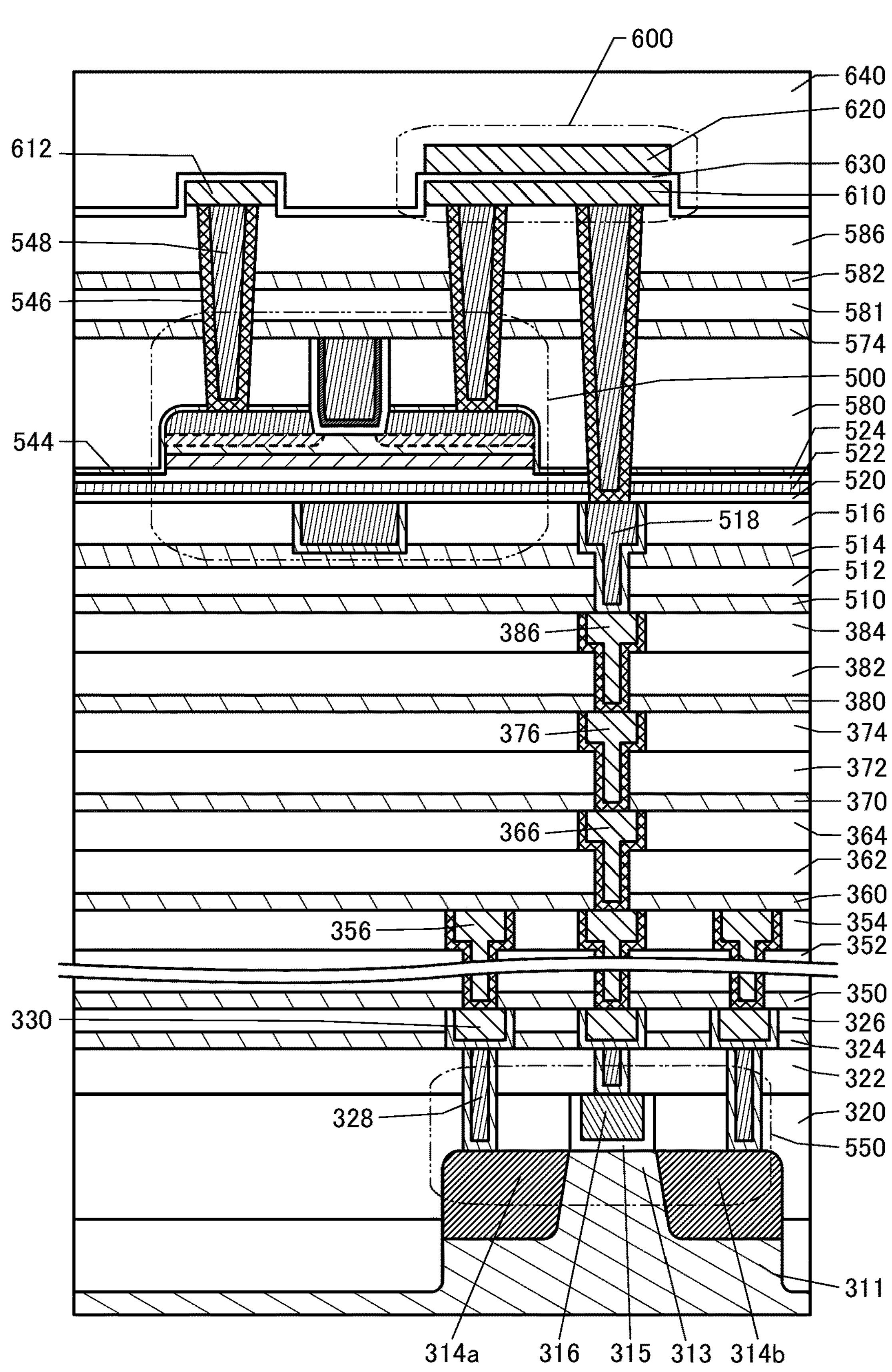
FIG. 4 is a diagram illustrating a structure example of transistors and a capacitor illustrating one embodiment of the present invention.

As an example, a structure in which transistors having different electrical characteristics are stacked is described. With the structure, the degree of freedom in design of the semiconductor device can be increased. Stacking transistors having different electrical characteristics can increase the degree of integration of the semiconductor device. In FIG. 4, a transistor 500 is a transistor including an oxide semiconductor in a channel formation region, and a transistor 550 is an example of a transistor using a silicon substrate.

FIG. 5A is a cross-sectional view of the transistor 500 in the channel length direction, FIG. 5B is a cross-sectional view of the transistor 500 in the channel width direction, and FIG. 5C is a cross-sectional view of the transistor 550 in the channel width direction. For example, the transistor 500 corresponds to the transistor OSFET described in Embodiment 1, and the transistor 550 corresponds to the transistor M1. A capacitor 600 in FIG. 4 corresponds to the capacitor C1 or the capacitor C2. Note that the OSFET in FIG. 3 corresponds to an example in which a conductor 503 described later is not provided.

The transistor 500 is an OS transistor. The transistor 500 has an extremely low off-state current. Accordingly, data voltage or charge written to a storage node through the transistor 500 can be retained for a long time. In other words, power consumption of the semiconductor device can be reduced because the storage node has a low frequency of refresh operation or requires no refresh operation.

As illustrated in FIG. 5C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314*a* and the low-resistance region 314*b* each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314*a* and the low-resistance region 314*b* contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI substrate or the like.

As the SOI substrate, the following substrate may be used: an SIMOX substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a Smart-Cut method in which a semiconductor substrate is cleaved by utilizing growth of a minute void, which is formed by implantation of a hydrogen ion, by thermal treatment, or by using an ELTRAN method (a registered trademark), for example. A transistor formed using a single crystal substrate contains a single crystal semiconductor in a channel formation region.

Note that the transistor 550 illustrated in FIG. 4 is an example and the structure is not limited thereto; an appropriate transistor can be used in accordance with a circuit structure or a driving method. For example, when the semiconductor device is a single-polarity circuit using only OS transistors (which represents a circuit with transistors having the same polarity, e.g., only n-channel transistors), the transistor 550 has a structure similar to that of the transistor 500, as illustrated in FIG. 4. Note that the details of the transistor 500 will be described later.

An insulator 320, an insulator 322, an insulator 324, and an insulator 326 are stacked in this order to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released. The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 4, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 4, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 4, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 4, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto.

Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 550 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 5A and FIG. 5B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; an insulator 545 positioned on a bottom and a side surface of the opening; and a conductor 560 positioned on a formation surface of the insulator 545.

As illustrated in FIG. 5A and FIG. 5B, an insulator 544 is preferably positioned between the insulator 580 and each of the oxide 530*a*, the oxide 530*b*, the conductor 542*a*, and the conductor 542*b*. Furthermore, as illustrated in FIG. 5A and FIG. 5B, the conductor 560 preferably includes a conductor 560*a* provided on the inner side of the insulator 545 and a conductor 560*b* provided to be embedded on the inner side of the conductor 560*a*. Moreover, as illustrated in FIG. 5A and FIG. 5B, an insulator 574 is preferably positioned over the insulator 580, the conductor 560, and the insulator 545.

Note that in this specification and the like, the oxide 530*a* and the oxide 530*b* are sometimes collectively referred to as an oxide 530.

Note that although a structure of the transistor 500 in which two layers of the oxide 530*a* and the oxide 530*b* are stacked in a region where a channel is formed and its vicinity is illustrated, the present invention is not limited thereto. For example, it is possible to employ a structure in which a single layer of the oxide 530*b* or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Moreover, the transistors 500 illustrated in FIG. 5A and FIG. 5B are examples, and the structures are not limited thereto; an appropriate transistor can be used in accordance with a circuit structure or a driving method.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate or back gate) electrode. In that case, the threshold voltage of the transistor 500 can be controlled by changing a potential applied to the conductor 503 not in synchronization with but independently of a voltage applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542*a* and the conductor 542*b* functioning as a source electrode and a drain electrode are of I-type like the channel formation region. The side surface and the vicinity of the oxide 530 that is in contact with the conductor 542*a* and the conductor 542*b* are in contact with the insulator 544, and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503*a* is formed in contact with an inner wall of an opening in the insulator 514 and the insulator 516, and a conductor 503*b* is formed on the inner side. Note that although the transistor 500 having a structure in which the conductor 503*a* and the conductor 503*b* are stacked is shown, the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. Note that although the conductor 503 is illustrated to have a stacked layer of the conductor 503*a* and the conductor 503*b* in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose VoH is sufficiently reduced. When an oxide semiconductor with sufficiently reduced impurities such as VoH is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "$V_OH \rightarrow V_O+H$" occurs. Part of hydrogen generated at this time is bonded to oxygen to be $H_2O$, and removed from the oxide 530 or an insulator in the vicinity of the oxide 530 in some cases. Part of hydrogen may be gettered into the conductor 542*a* and the conductor 542*b* in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow$null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500 in FIG. 5A and FIG. 5B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element Min the metal oxide used as the oxide 530*b* is preferably higher than the atomic ratio of In to the element Min the metal oxide used as the oxide 530*a*.

The energy of the conduction band minimum of the oxide 530*a* is preferably higher than the energy of the conduction band minimum of the oxide 530*b*. In other words, the electron affinity of the oxide 530*a* is preferably smaller than the electron affinity of the oxide 530*b*. Here, the energy level of the conduction band minimum gently changes at a junction portion of the oxide 530*a* and the oxide 530*b*. In other words, the energy level of the conduction band minimum at the junction portion of the oxide 530*a* and the oxide 530*b* continuously changes or is continuously connected. This can be obtained by decreasing the density of defect states in a mixed layer formed at the interface between the oxide 530*a* and the oxide 530*b*.

Specifically, when the oxide 530*a* and the oxide 530*b* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is used as the oxide 530*a*.

At this time, the oxide 530*b* serves as a main carrier path. When the oxide 530*a* has the above-described structure, the density of defect states at the interface between the oxide 530*a* and the oxide 530*b* can be made low. Thus, the influence of interface scattering on carrier conduction is small, and the transistor 500 can have a high on-state current.

The conductor 542*a* and the conductor 542*b* functioning as the source electrode and the drain electrode are provided over the oxide 530*b*. For the conductor 542*a* and conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542*a* and the conductor 542*b* each having a single-layer structure are illustrated in FIG. 5A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 5A, a region 543*a* and a region 543*b* are sometimes formed as low-resistance regions at an interface between the oxide 530 and the conductor 542*a* (the conductor 542*b*) and in the vicinity of the interface. In that case, the region 543*a* functions as one of a source region and a drain region, and the region 543*b* functions as the other of the source region and the drain region. Furthermore, the channel formation region is formed in a region between the region 543*a* and the region 543*b*.

When the conductor 542*a* (the conductor 542*b*) is provided to be in contact with the oxide 530, the oxygen concentration in the region 543*a* (the region 543*b*) sometimes decreases. In addition, a metal compound layer that contains the metal contained in the conductor 542*a* (the conductor 542*b*) and the component of the oxide 530 is sometimes formed in the region 543*a* (the region 543*b*). In such a case, the carrier density of the region 543*a* (the region 543*b*) increases, and the region 543*a* (the region 543*b*) becomes a low-resistance region.

The insulator 544 is provided to cover the conductor 542*a* and the conductor 542*b* and inhibits oxidation of the conductor 542*a* and the conductor 542*b*. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542*a* and the conductor 542*b* are oxidation-resistant materials or do not significantly lose their conductivity even after absorbing oxygen. Design is appropriately determined in consideration of required transistor characteristics.

When the insulator 544 is included, diffusion of impurities such as water and hydrogen contained in the insulator 580 into the oxide 530*b* through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530*b*. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 5A and FIG. 5B, a single-layer structure or a stacked-layer structure of three or more layers may be employed.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, a reduction in conductivity of the conductor 560*b* due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560*a*, the oxide semiconductor that can be used as the oxide 530 can be used. In that case, when the conductor 560*b* is deposited using a sputtering method, the conductor 560*a* can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560*b*. Furthermore, the conductor 560*b* also functions as a wiring and thus a conductor having high conductivity is preferably used as the conductor 560*b*. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 320 can be used. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stacked-layer structure of a tungsten film and a silicon oxide film that are inorganic films, a structure in which an organic resin film of polyimide or the like is formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

<Modification Example 1 of Transistor>

Figure 6A:
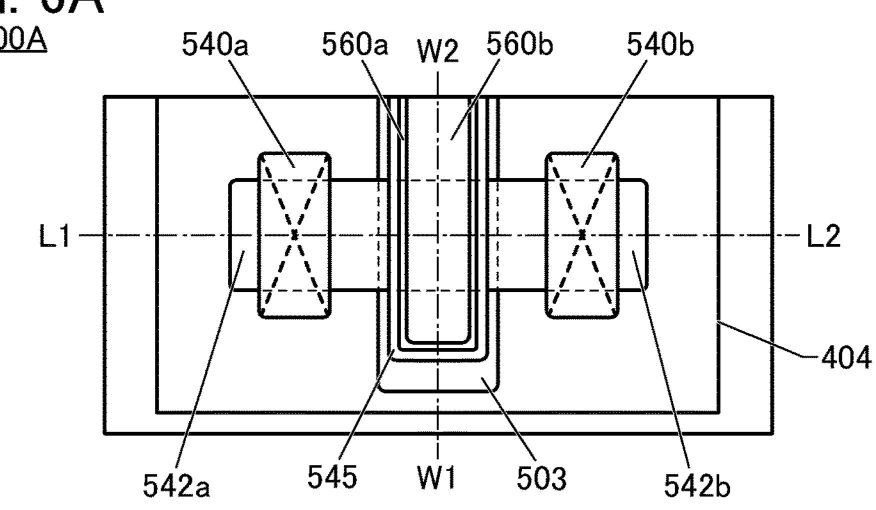
FIG. 6A to FIG. 6C are diagrams illustrating a transistor structure example.
Figure 6B:
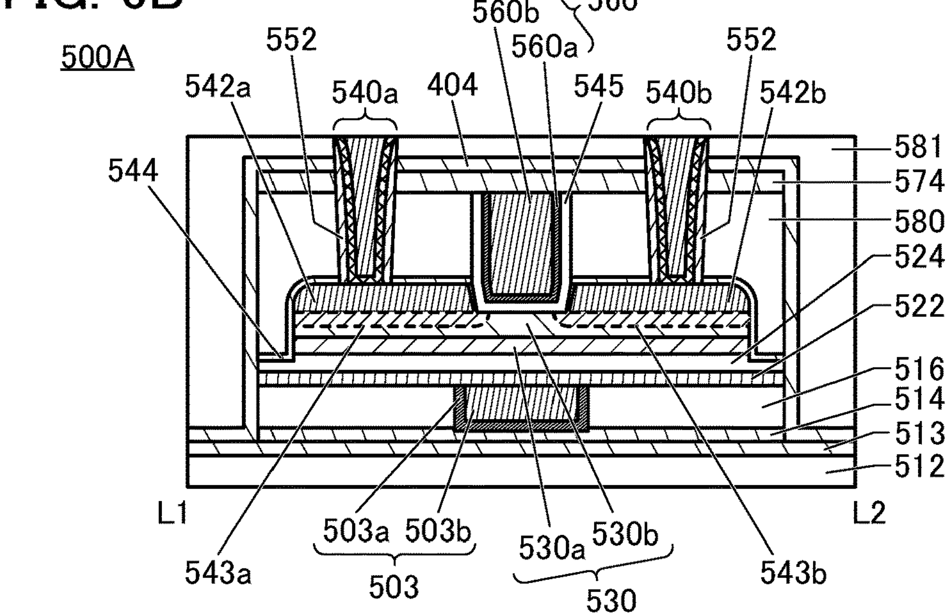
Figure 6C:
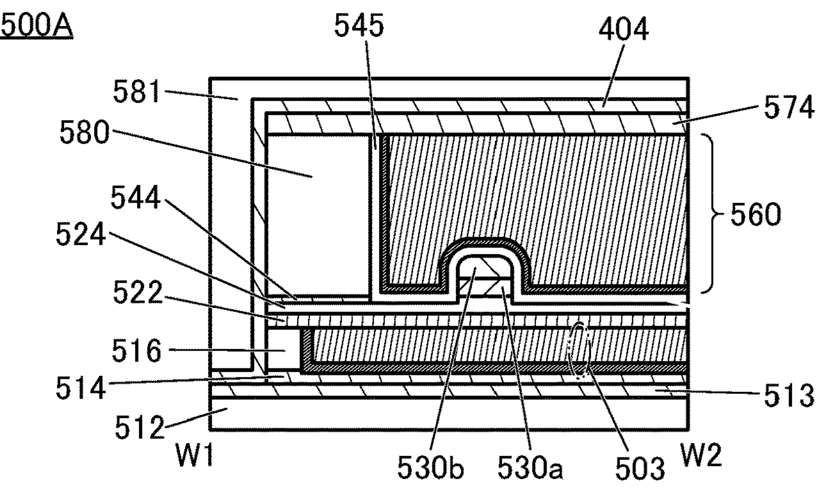

A transistor 500A illustrated in FIG. 6A to FIG. 6C is a modification example of the transistor 500 having the structure illustrated in FIG. 5A and FIG. 5B. FIG. 6A is a top view of the transistor 500A, FIG. 6B is a cross-sectional view of the transistor 500A in the channel length direction, and FIG. 6C is a cross-sectional view of the transistor 500A in the channel width direction. Note that the structure illustrated in FIG. 6A to FIG. 6C can also be used for other transistors such as the transistor 550 included in the semiconductor device of one embodiment of the present invention.

The transistor 500A having the structure illustrated in FIG. 6A to FIG. 6C is different from the transistor 500 having the structure illustrated in FIG. 5A and FIG. 5B in including an insulator 552, an insulator 513, and an insulator 404. Furthermore, the transistor 500A having the structure illustrated in FIG. 6A to FIG. 6C is different from the transistor 500 having the structure illustrated in FIG. 5A and FIG. 5B in that the insulator 552 is provided in contact with a side surface of the conductor 540*a* and a side surface of the conductor 540*b*. Moreover, the transistor 500A having the structure illustrated in FIG. 6A to FIG. 6C is different from the transistor 500 having the structure illustrated in FIG. 5A and FIG. 5B in not including the insulator 520.

In the transistor 500A having the structure illustrated in FIG. 6A to FIG. 6C, the insulator 513 is provided over the insulator 512. The insulator 404 is provided over the insulator 574 and the insulator 513.

In the transistor 500A having the structure illustrated in FIG. 6A to FIG. 6C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. As described above, the reliability of the semiconductor device of one embodiment of the present invention can be increased.

<Modification Example 2 of Transistor>

Figure 7A:
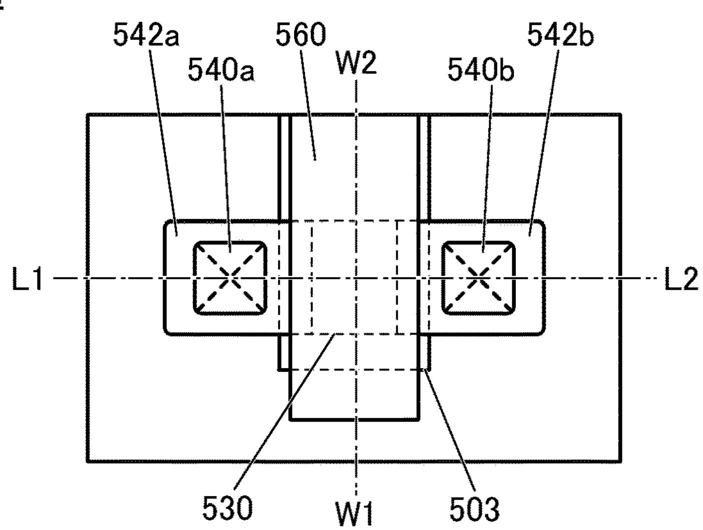
FIG. 7A to FIG. 7C are diagrams illustrating a transistor structure example.
Figure 7B:
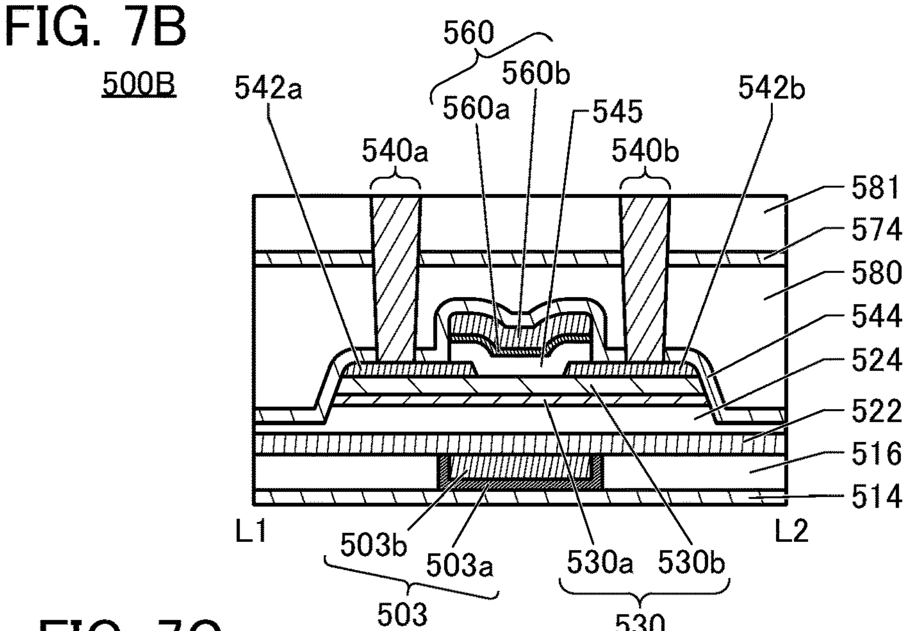
Figure 7C:
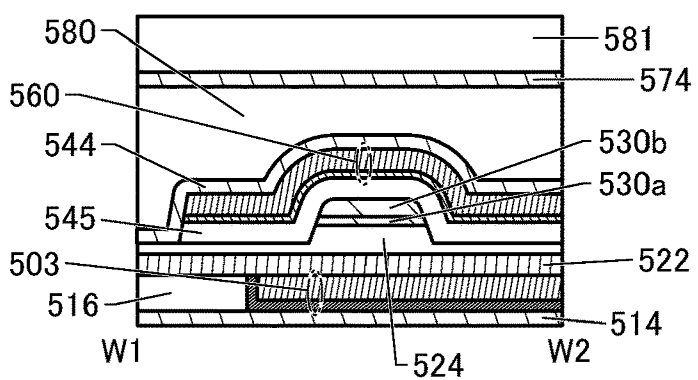

A structure example of a transistor 500B is described with reference to FIG. 7A, FIG. 7B, and FIG. 7C. FIG. 7A is a top view of the transistor 500B. FIG. 7B is a cross-sectional view of a portion indicated by dashed-dotted line L1-L2 in FIG. 7A. FIG. 7C is a cross-sectional view of a portion indicated by a dashed-dotted line W1-W2 in FIG. 7A. Note that for clarity of the drawing, some components are not illustrated in the top view of FIG. 7A.

The transistor 500B is a modification example of the transistor 500 and can be replaced with the transistor 500. Therefore, differences of the transistor 500B from the transistor 500 will be mainly described to avoid repeated description.

The conductor 560 functioning as a first gate electrode includes the conductor 560*a* and the conductor 560*b* over the conductor 560*a*. For the conductor 560*a*, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560*a* has a function of inhibiting oxygen diffusion, the range of choices for the material of the conductor 560*b* can be extended. That is, the conductor 560*a* inhibits oxidation of the conductor 560*b*, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542*a* and part of the conductor 542*b*, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in an appropriate combination with the compositions, structures, methods, and the like described in the other embodiments and the like.

Embodiment 3

In this embodiment, examples of a package and a camera module in each of which an image sensor chip is placed will be described. For the image sensor chip, the structure of the imaging device of one embodiment of the present invention illustrated in FIG. 3 can be used.

FIG. 8A is an external perspective view of the top surface side of a package in which an image sensor chip is placed. The package includes a package substrate 810 to which an image sensor chip 850 is fixed, a cover glass 820, an adhesive 830 for bonding the package substrate 810 and the cover glass 820, and the like.

FIG. 8B is an external perspective view of the bottom surface side of the package. A BGA (Ball grid array) structure in which solder balls are provided as bumps 840 on the bottom surface of the package is used. Note that, not limited to the BGA, an LGA (Land grid array), a PGA (Pin grid array), or the like may be employed.

FIG. 8C is a perspective view of the package, in which part of the cover glass 820 and adhesive 830 is not illustrated, and FIG. 8D is a cross-sectional view of the package. Electrode pads 860 are formed over the package substrate 810, and the electrode pads 860 and the bumps 840 are electrically connected via through-holes 880 and lands 885. The electrode pads 860 are electrically connected to electrodes of the image sensor chip 850 through wires 870.

Figures 9A, 9B, 9C, 9D:
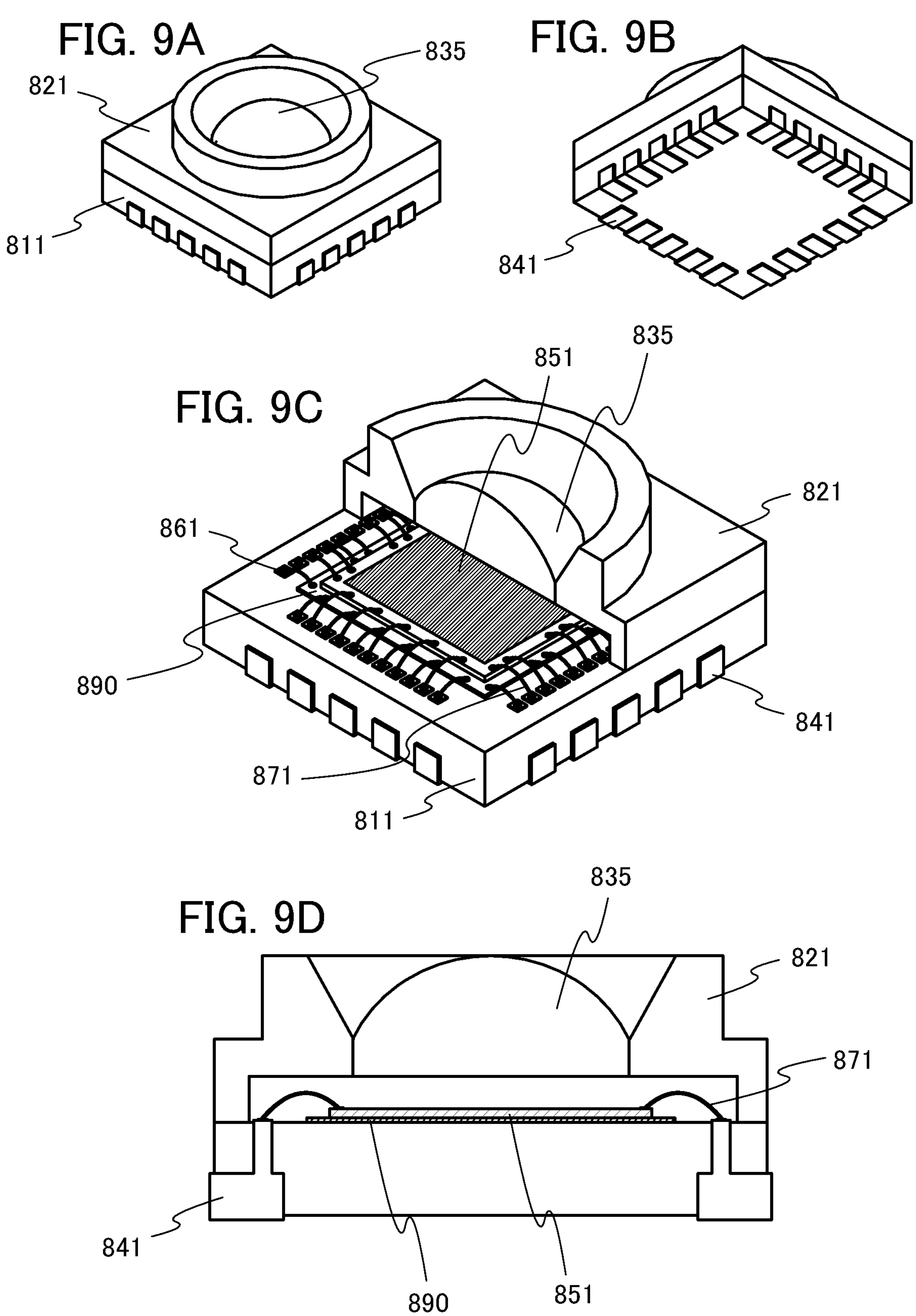
FIG. 9A to FIG. 9C are perspective views of a package including an imaging device.
FIG. 9D is a cross-sectional view.

Furthermore, FIG. 9A is an external perspective view of the top surface side of a camera module in which an image sensor chip is placed in a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851; thus, the structure as an SiP (System in package) is formed.

FIG. 9B is an external perspective view of the bottom surface side of the camera module. On the bottom surface and four side surfaces of the package substrate 811, a QFN (Quad flat no-lead package) structure in which lands 841 for mounting are provided is used. Note that this structure is just an example, and a QFP (Quad flat package), the above-mentioned BGA, or the like may also be employed.

FIG. 9C is a perspective view of the module, in which part of the lens cover 821 and lens 835 is not illustrated, and FIG. 9D is a cross-sectional view of the camera module. The lands 841 are partly used as electrode pads 861, and the electrode pads 861 are electrically connected to electrodes of the image sensor chip 851 and the IC chip 890 through wires 871.

The image sensor chip placed in a package having the above form can be easily mounted on a printed substrate or the like, and the image sensor chip can be incorporated into a variety of semiconductor devices and electronic devices.

The structure described in this embodiment can be used in an appropriate combination with the structure described in the other embodiments.

Embodiment 4

As electronic devices that can include an imaging device of one embodiment of the present invention and a semiconductor device including the imaging device, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 10.

Figure 10A:
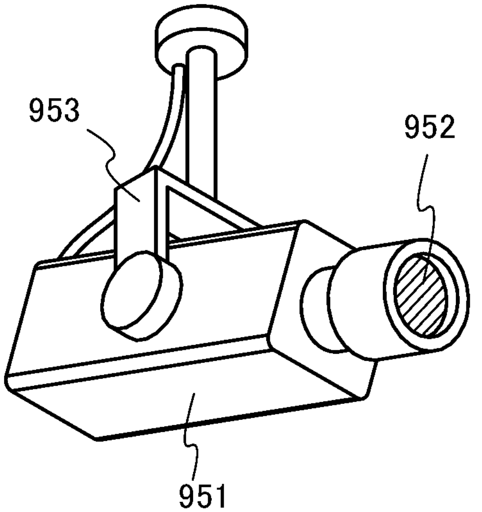
FIG. 10A to FIG. 10F are perspective views illustrating electronic devices.

FIG. 10A is a surveillance camera, which includes a housing 951, a lens 952, a support portion 953, and the like. The imaging device of one embodiment of the present invention can be included, as a component for obtaining an image, in the surveillance camera. Note that a surveillance camera is a name in common use and does not limit the use thereof. A device that has a function of a surveillance camera can also be called a camera or a video camera, for example.

Figure 10B:
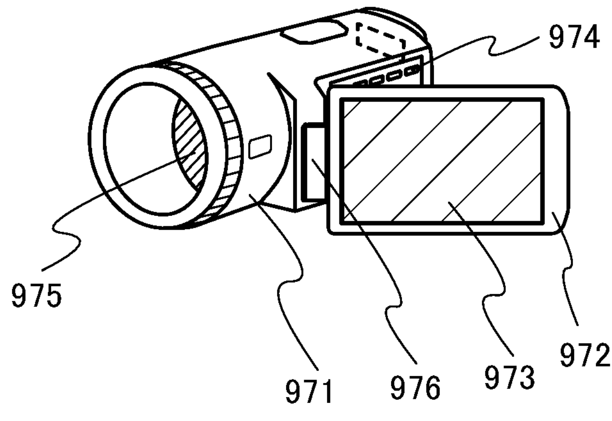

FIG. 10B is a video camera, which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera. The imaging device of one embodiment of the present invention can obtain an image with a wider dynamic range.

Figure 10C:
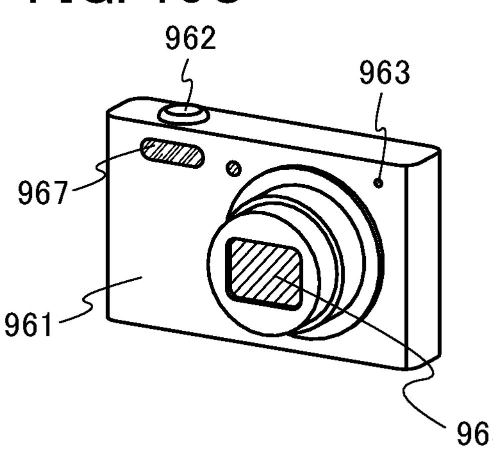

FIG. 10C is a digital camera, which includes a housing 961, a shutter button 962, a microphone 963, a light-emitting portion 967, a lens 965, and the like. The imaging device of one embodiment of the present invention can be included, as a component for obtaining an image, in the digital camera. The imaging device of one embodiment of the present invention can obtain an image with a wider dynamic range.

Figure 10D:
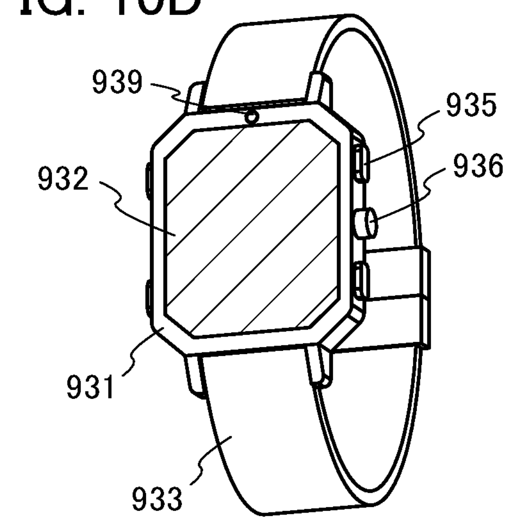

FIG. 10D is a wrist-watch-type information terminal, which includes a housing 931, a display portion 932, a wristband 933, an operation button 935, a crown 936, a camera 939, and the like. The display portion 932 may be a touch panel. The imaging device of one embodiment of the present invention can be included, as a component for obtaining an image, in the information terminal. The imaging device of one embodiment of the present invention can obtain an image with a wider dynamic range.

Figure 10E:
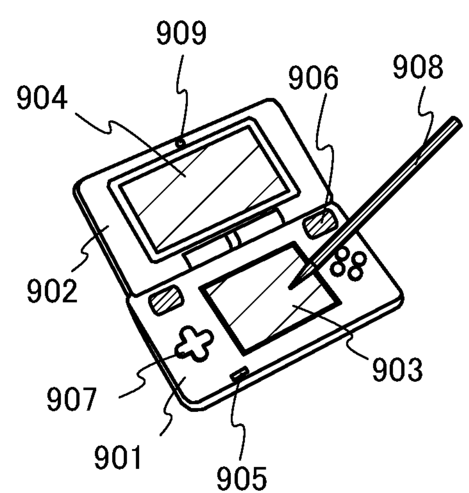

FIG. 10E is a portable game machine, which includes a housing 901, a housing 902, a display portion 903, a display portion 904, a microphone 905, a speaker 906, an operation key 907, a stylus 908, a camera 909, and the like. Note that although the portable game machine illustrated in FIG. 10E includes the two display portions 903 and 904, the number of display portions included in the portable game machine is not limited to this. The imaging device of one embodiment of the present invention can be included, as a component for obtaining an image, in the portable game machine. The imaging device of one embodiment of the present invention can obtain an image with a wider dynamic range.

Figure 10F:
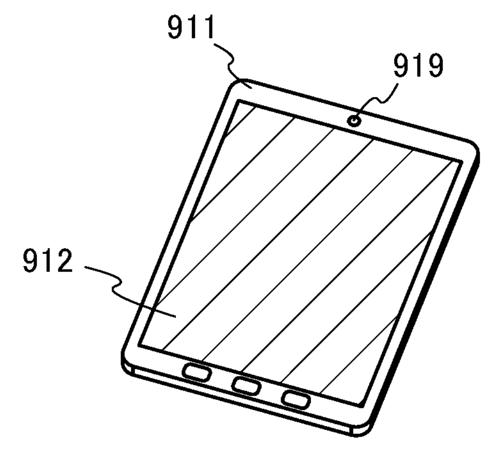

FIG. 10F is a portable data terminal, which includes a housing 911, a display portion 912, a speaker, a camera 919, and the like. A touch panel function of the display portion 912 enables input and output of information. The imaging device of one embodiment of the present invention can be included, as a component for obtaining an image, in the portable data terminal. The imaging device of one embodiment of the present invention can obtain an image with a widened dynamic range.

Note that this embodiment can be combined with any of the other embodiments in this specification as appropriate.

REFERENCE NUMERALS

311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503*a*: conductor, 503*b*: conductor, 510: insulator, 512: insulator, 513: insulator, 514: insulator, 516: insulator, 518: conductor, 520: insulator, 522: insulator, 524: insulator, 530: oxide, 530*a*: oxide, 530*b*: oxide, 540*a*: conductor, 540*b*: conductor, 542*a*: conductor, 542*b*: conductor, 543*a*: region, 543*b*: region, 544: insulator, 545: insulator, 546: conductor, 548: conductor, 550: transistor, 552: insulator, 560: conductor, 560*a*: conductor, 560*b*: conductor, 574: insulator, 580: insulator, 581: insulator, 582: insulator, 586: insulator, 600: capacitor, 610: conductor, 612: conductor, 620: conductor, 630: insulator, 640: insulator, 810: package substrate, 811: package substrate, 820: cover glass, 821: lens cover, 830: adhesive, 835: lens, 840: bump, 841: land, 850: image sensor chip, 851: image sensor chip, 860: electrode pad, 861: electrode pad, 870: wire, 871: wire, 880: through-hole, 885: land, 890: IC chip, 901: housing, 902: housing, 903: display portion, 904: display portion, 905: microphone, 906: speaker, 907: operation key, 908: stylus, 909: camera, 911: housing, 912: display portion, 919: camera, 931: housing, 932: display portion, 933: wristband, 935: button, 936: crown, 939: camera, 951: housing, 952: lens, 953: support portion, 961: housing, 962: shutter button, 963: microphone, 965: lens, 967: light-emitting portion, 971: housing, 972: housing, 973: display portion, 974: operation key, 975: lens, 976: connection portion

The invention claimed is:

1. An imaging device comprising a first transistor to a sixth transistor, a photoelectric conversion element, a first capacitor, and a second capacitor, wherein one electrode of the photoelectric conversion element is electrically connected to one of a source and a drain of the first transistor, wherein the other of the source and the drain of the first transistor is electrically connected to a source and a drain of the second transistor, wherein the other of the source and the drain of the first transistor is electrically connected to one electrode of the first capacitor, wherein the other of the source and the drain of the first transistor is electrically connected to a gate electrode of the third transistor, wherein one of a source and a drain of the third transistor is electrically connected to one of a source and a drain of the fourth transistor, wherein the other of the source and the drain of the second transistor is electrically connected to one electrode of the second capacitor, wherein the one electrode of the second capacitor is electrically connected to one of a source and a drain of the fifth transistor, wherein the other of the source and the drain of the fifth transistor is electrically connected to a wiring to which a constant potential is supplied, wherein the fifth transistor is a reset transistor, wherein one of a source and a drain of the sixth transistor is electrically connected to the one of the source and the drain of the first transistor, wherein the first transistor, the third transistor, the fourth transistor, and the sixth transistor each comprise silicon in a region where a channel is formed, and wherein the second transistor and the fifth transistor each comprise an oxide semiconductor in a region where a channel is formed.

2. The imaging device according to claim 1, wherein the second capacitor has larger capacitance than the first capacitor.

3. The imaging device according to claim 1, wherein the photoelectric conversion element and the first transistor are provided to be adjacent to each other, the photoelectric conversion element is provided to be adjacent to the sixth transistor, and the first transistor, the photoelectric conversion element, and the sixth transistor are manufactured on the same silicon substrate.

4. An imaging device comprising a first transistor to a sixth transistor, a photoelectric conversion element, a first capacitor, and a second capacitor, wherein one electrode of the photoelectric conversion element is directly connected to one of a source and a drain of the first transistor, wherein the other of the source and the drain of the first transistor is directly connected to a source and a drain of the second transistor, wherein the other of the source and the drain of the first transistor is directly connected to one electrode of the first capacitor, wherein the other of the source and the drain of the first transistor is directly connected to a gate electrode of the third transistor, wherein one of a source and a drain of the third transistor is directly connected to one of a source and a drain of the fourth transistor, wherein the other of the source and the drain of the second transistor is directly connected to one electrode of the second capacitor, wherein the one electrode of the second capacitor is directly connected to one of a source and a drain of the fifth transistor, wherein the other of the source and the drain of the fifth transistor is electrically connected to a wiring to which a constant potential is supplied, wherein the fifth transistor is a reset transistor, wherein one of a source and a drain of the sixth transistor is directly connected to the one of the source and the drain of the first transistor, wherein the first transistor, the third transistor, the fourth transistor, and the sixth transistor each comprise silicon in a region where a channel is formed, and wherein the second transistor and the fifth transistor each comprise an oxide semiconductor in a region where a channel is formed.

5. The imaging device according to claim 4, wherein the second capacitor has larger capacitance than the first capacitor.

6. The imaging device according to claim 4, wherein the photoelectric conversion element and the first transistor are provided to be adjacent to each other, the photoelectric conversion element is provided to be adjacent to the sixth transistor, and the first transistor, the photoelectric conversion element, and the sixth transistor are manufactured on the same silicon substrate.

7. An imaging device comprising a first transistor to a sixth transistor, a photoelectric conversion element, a first capacitor, and a second capacitor, wherein one electrode of the photoelectric conversion element is directly connected to one of a source and a drain of the first transistor, wherein the other of the source and the drain of the first transistor is directly connected to a source and a drain of the second transistor, wherein the other of the source and the drain of the first transistor is directly connected to one electrode of the first capacitor, wherein the other of the source and the drain of the first transistor is directly connected to a gate electrode of the third transistor, wherein one of a source and a drain of the third transistor is directly connected to one of a source and a drain of the fourth transistor, wherein the other of the source and the drain of the second transistor is directly connected to one electrode of the second capacitor, wherein the one electrode of the second capacitor is directly connected to one of a source and a drain of the fifth transistor, wherein the other of the source and the drain of the fifth transistor is electrically connected to a wiring to which a constant potential is supplied, wherein the fifth transistor is a reset transistor, wherein one of a source and a drain of the sixth transistor is directly connected to the one of the source and the drain of the first transistor, and wherein the second transistor and the fifth transistor each comprise an oxide semiconductor in a region where a channel is formed.

8. The imaging device according to claim 7, wherein the second capacitor has larger capacitance than the first capacitor.

9. The imaging device according to claim 7, wherein the photoelectric conversion element and the first transistor are provided to be adjacent to each other, the photoelectric conversion element is provided to be adjacent to the sixth transistor, and the first transistor, the photoelectric conversion element, and the sixth transistor are manufactured on the same silicon substrate.

* * * * *